(12) United States Patent
Nasiri et al.

(10) Patent No.: US 7,250,353 B2
(45) Date of Patent: Jul. 31, 2007

(54) METHOD AND SYSTEM OF RELEASING A MEMS STRUCTURE

(75) Inventors: Steven S. Nasiri, Saratoga, CA (US); Anthony Francis Flannery, Jr., Los Gatos, CA (US); Martin Lim, San Mateo, CA (US)

(73) Assignee: InvenSense, Inc., Saratoga, CA (US)

( * ) Notice: Subject to any disclaimer, the term of this patent is extended or adjusted under 35 U.S.C. 154(b) by 23 days.

(21) Appl. No.: 11/094,101

(22) Filed: Mar. 29, 2005

(65) Prior Publication Data

US 2006/0228831 A1 Oct. 12, 2006

(51) Int. Cl.
 *H01L 21/46* (2006.01)
 *H01L 21/78* (2006.01)
 *H01L 21/326* (2006.01)

(52) U.S. Cl. ............ 438/460; 438/689; 438/706; 438/745; 257/E21; 257/499; 257/503

(58) Field of Classification Search ........... 438/460, 438/455, 612, 706, 712, 734, 745, 689
 See application file for complete search history.

(56) References Cited

U.S. PATENT DOCUMENTS

| 6,232,150 | B1 * | 5/2001 | Lin et al. ............... 438/119 |
| 6,297,072 | B1 * | 10/2001 | Tilmans et al. ........ 438/106 |
| 6,624,003 | B1 * | 9/2003 | Rice ..................... 438/106 |
| 6,660,564 | B2 * | 12/2003 | Brady ................... 438/119 |
| 6,806,557 | B2 * | 10/2004 | Ding ..................... 257/659 |
| 6,822,326 | B2 * | 11/2004 | Enquist et al. ......... 257/729 |
| 6,939,473 | B2 * | 9/2005 | Nasiri et al. ............ 216/2 |

* cited by examiner

*Primary Examiner*—David Nhu
(74) *Attorney, Agent, or Firm*—Sawyer Law Group LLP

(57) ABSTRACT

A MEMs (microelectromechanical systems) structure is provided. In one implementation, the MEMs structure includes a substrate wafer including a MEMs device formed on a surface of the substrate wafer, and a MEMs cover structure to cover the MEMs device formed on the surface of the substrate wafer. The MEMs cover structure comprises a first wafer bonded to a second wafer, in which only the first wafer of the MEMs cover structure is sawed through and not the second wafer of the MEMs cover structure during dicing of the MEMs structure.

8 Claims, 3 Drawing Sheets

METHOD AND SYSTEM OF RELEASING A MEMS STRUCTURE

FIELD OF THE INVENTION

The present invention relates generally to a MEMS structure and more specifically to a method and system for releasing such a structure after manufacturing.

RELATED APPLICATIONS

U.S. patent application Ser. No. 10/691,472, ENTITLED "Method of Making an X-Y Axis Dual-Mass Tuning Fork Gyroscope with Vertically Integrated Electronics and Wafer-Scale Hermetic Packaging," filed Oct. 20, 2003.

U.S. patent application Ser. No. 10/770,838, entitled "Vertically Integrated MEMS Structure," filed Feb. 2, 2004.

U.S. patent application Ser. No. 10/771,135, entitled "Vertical Integration of a MEMS Structure with Electronics in a Hermetically Sealed Cavity," filed Feb. 2, 2004.

BACKGROUND OF THE INVENTION

MEMS technology has been under steady development for some time, and as a result various MEMS devices have been considered and demonstrated for several applications. MEMS technology is an attractive approach for providing many products, such as inertial sensors, accelerometers for measuring linear acceleration, gyroscopes for measuring angular velocity, optical devices, pressure sensors, etc. A MEMS inertial sensor typically includes a proof mass which is flexibly attached to the rest of the device. Relative motion between the proof mass and the rest of the device is driven by actuators and/or sensed by sensors in various ways, depending on the detailed device design. Other MEMS applications include optical applications such as movable mirrors, and RF applications such as RF switches and resonators.

MEMS devices typically have mechanical features that photo lithographically are defined on the surface or within the silicon substrates. There are two classes of MEMS technology, bulk silicon and surface-micromachining. In case of bulk silicon, features are created by selectively removing silicon to form the desired structures. In case of surface-micromachining, it is an additive process using polysilicon layers on top of sacrificial oxides and then by removing the sacrificial layers MEMS structures are created.

Both MEMS technologies require post MEMS processing and packaging. Most MEMS sensors and/or actuators require electrical inputs and output to perform their design functions. Traditionally MEMS devices required custom cavity based packages to provide for such input and output access. MEMS features are generally very fragile and sensitive to dusts and particles. Most MEMS features are measured in microns and require special assembly and packaging care. Such non-standard packaging has been primary contributor to the inherent high cost of many MEMS devices.

There has been a constant and growing trend in the MEMS industry for doing what is known as die-level-packaging (DLP). DLP is generally provides for a protective cover over the sensitive MEMS feature that will allow the part to be handled by standard assembly and packaging means. One common method has been to have pre-fabricated silicon covers to be picked and placed on top of the MEMS structure by automated means prior to dicing the MEMS wafers.

Yet another preferred method is to provide for protective covers by etching cavities in a silicon wafer and placing it on top of the MEMS wafer by various means, solder, glass frits, adhesives, to name just a few. This is preferred over the pick and place capping technique since it is performed at wafer level and not at device level.

However, one of the key challenges in performing any of the protective capping techniques has been to allow for easy access to the input/output pads. In the field of MEMS, it is often required that a release step is performed that exposes critical features. This release step is typically a type of etch that removes material, often silicon, in the region of interest.

One common method for making such access is to provide for some access openings in the cover wafer such that the features of interest are accessible after the cover attach. However, this requires added processing and the etching through the wafers. There are several limitations to this method. First, the number of openings per device are fairly limited due to mechanical limitations and wafer fragility in case of many openings. Secondly, the openings can not be continuous on any one side. Etching a hole through a wafer has its challenges and requires careful design and process development.

Wet etching is often performed with alkali hydroxide or similar chemistries that are known to etch silicon. The disadvantage of this method is that all materials present on the wafer must either be compatible (i.e., not etch) or they must be protected. The number of compatible materials is limited, particularly if the release takes a significant amount of time. Protecting incompatible materials requires an additional process step, and often creates process compatibility issues of its own.

Finally, another disadvantage of this method is the difficulty in masking this etch. For long, through-wafer etching, the number of materials that can be effectively patterned as a mask are quite limited.

Another potential option for such openings is by means of dry etching after cover attachment, know as DRIE. The DRIE process is relatively slow and it is performed one wafer at a time. Etching through 400 to 500 microns of silicon cover can take a significant amount of time and is also a fairly costly process. Dry etching has also successfully been used, particularly deep reactive ion etching, as it can achieve high aspect ratio etching, can be masked easily, and has been demonstrated to have high selectivity. However, a DRIE system is costly, requiring significant capital expenditure. Furthermore, a DRIE process is time consuming when removing significant (>200 μm) amount of silicon. Accordingly, the throughput of the machine utilized for etching is significantly limited.

Dry etching requires patterning a masking material to define the feature(s) to be released, similar to wet etching, and has the same problems associated therewith.

Yet another method of releasing a feature is by sawing of the portion of cover wafers that are not protecting the MEMS features and obscuring the access to the input/output features. The problem with this approach is that it is difficult to control the depth of the saw into the cover wafer accurately. In addition, removal of the unwanted silicon tabs after sawing is often destructive and potentially damaging. Alternatively, a clearing channel can be etched into the cover wafer to allow for sawing operation, but this is also problematic. Since the saw slurry will get under the silicon and over the contact pads which results in poor contact and wire bond assembly. Also, having large pieces of silicon tabs flying off the wafers during the saw operation is not considered standard and often results in damage to the saw blades.

Accordingly, what is needed is a system and method for releasing a MEMS cover-structure which should be cost-effective, and easily implemented and adaptable to existing assembly and packaging tools. The present invention addresses such a need.

SUMMARY OF THE INVENTION

A method and system for releasing MEMS cover-structure on a wafer is disclosed. It includes at least one MEMS wafer structure made up of two wafers, one protective cover, and one containing at least one MEMS feature that are bonded together by various standard wafer bonding means. Also, one wafer substrate with patterned aluminum features and input/output pads. The method and system comprise providing for a built in channels between the said first cover wafer, and second said MEMS wafer allowing for a saw blade to cut a channel into the cover wafer, while the MEMS wafer providing for protection against saw slurries to get over the contact pad area on the said substrate wafer. Providing a tab area over the at least one bond pad and the dicing of the tab area to remove at least a portion of tab area above the at least one bond pad.

A method and system of using industry dicing techniques to release the MEMS cover-structure from the substrate is disclosed. Dicing is much more benign chemically and is compatible with a much greater range of materials. The cost of dicing and complexity of infrastructure required are much less than that required for DRIE. Also, unlike conventional methods, a dicing release does not require an additional masking step.

DETAILED DESCRIPTION

The present invention relates generally to a MEMS structure and more specifically to a method and system for releasing such a structure after manufacturing. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
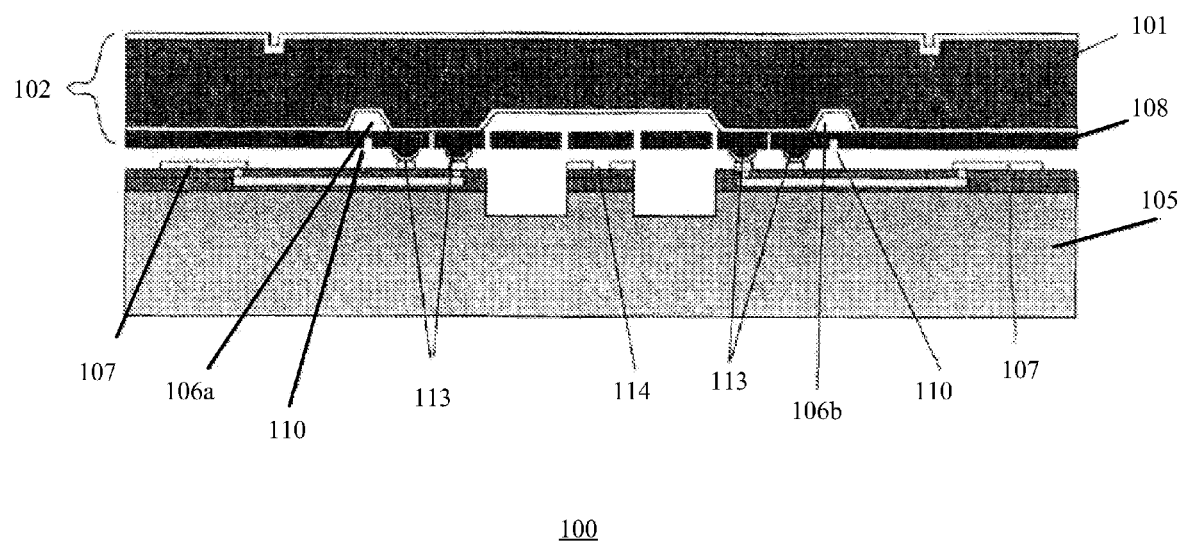
FIG. 1 is a MEMS device 100 which includes a tab area above the bond pads of the device.

The following describes a preferred embodiment in accordance with the present invention. FIG. 1 is a MEMS device 100. The MEMS device 100 includes a MEMS cover structure 102 which comprises two bonded MEMS wafers 101 and 108 over a desired structure 114 on a substrate wafer 105. A plurality of standoffs 113 are between the MEMS wafer 108 and the substrate wafer 105. The MEMS cover structure 102 includes a plurality of breakaway tabs. The cover structure 102 is created as part of the fabrication process for the MEMS device 100. In a preferred embodiment, release features 106a and 106b are etched into the MEMS cover structure 102. The release features 106a and 106b are of sufficient depth that precision of depth control of a dicing saw (not shown) can place the depth of the cut no deeper than within the cavity.

In this embodiment, after completion of all required processing, the tab area over the bond pads 107 is released by dicing two scribe lines across the whole device or wafer 100. As is seen the features of the substrate wafer 105 are protected by the overhang of the MEMS wafer 108. The overhang of the MEMS wafer 108 protects the bond pad 107 from the saw slurries of the dicing saw. The overhang area of the MEMS wafer 108 also includes a small notch 110 to aid in the breakage during the dicing process. The MEMS wafer 108 is typically 35 µm in thickness. The MEMS cover layer 101 is typically 400 µm in thickness.

Figure 2:
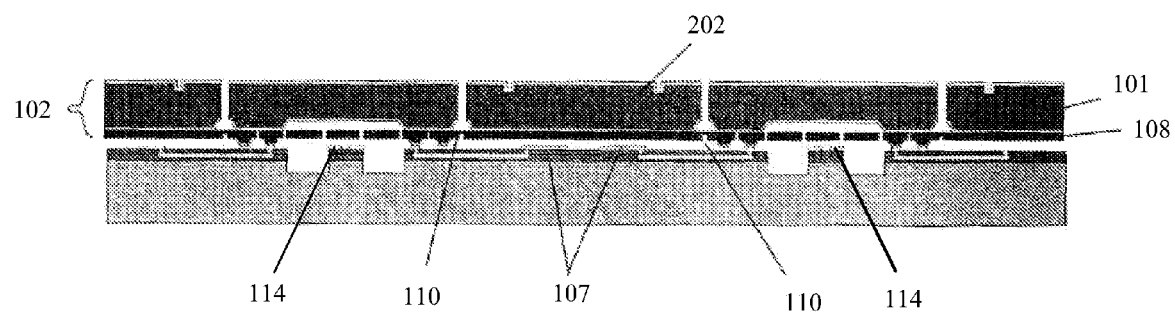
FIG. 2 illustrates the MEMS device after dicing operation.

FIG. 2 illustrates the MEMS device 100 after dicing operation. The precision of the dicing provides the alignment and feature control that was accomplished with a lithography/masking step in the prior art. The tab structure 202 is now fully suspended by the thin membrane of the MEMS wafer 108 and can be easily removed by a variety of mechanical fixtures and techniques.

Figure 3:
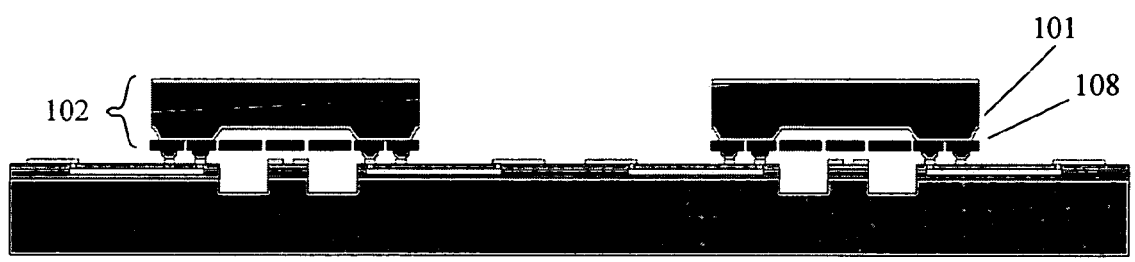
FIG. 3 illustrates the MEM device after removal of the tab area.

The breakaway tabs can now be removed with a simple mechanical fixture (not shown). FIG. 3 illustrates the MEMS device 100 after removal of the breakaway tabs from the MEMS cover structure 102.

In an alternative embodiment in accordance with the present invention, the release features are defined by different methods (KOH etching, DRIE etching, etc.).

In a second alternative embodiment in accordance with the present invention, there are no release features.

A method and system of using industry dicing techniques to release the MEMS structure from the substrate is disclosed. Dicing is much more benign chemically and is compatible with a much greater range of materials. The cost of dicing and complexity of infrastructure required are much less than that required for DRIE. Also, unlike conventional methods, a dicing release does not require an additional masking step.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMs (microelectromechanical systems) structure comprising:
   a substrate wafer including a MEMs device formed on a surface of the substrate wafer; and
   a MEMs cover structure to cover the MEMs device formed on the surface of the substrate wafer, the MEMs cover structure comprising a first wafer bonded to a second wafer,
   wherein only the first wafer of the MEMs cover structure is sawed through and not the second wafer of the MEMs cover structure during dicing of the MEMs structure.

2. The MEMs structure of claim 1, wherein the first wafer of the MEMs cover structure includes a plurality of release structures that each forms a cavity between the first wafer and the second wafer, the plurality of release structures being formed at dicing locations for a dicing saw.

3. The MEMs structure of claim 2, wherein the second wafer of the MEMs cover structure includes a plurality of notches to aid in break away of portions of the MEMs cover structure after dicing of the MEMs structure.

4. The MEMs structure of claim 3, wherein the plurality of notches in the second wafer of the MEMs cover are located adjacent to the plurality of release structures in the first wafer of the MEMs cover structure.

5. The MEMs structure of claim 4, wherein the first wafer of the MEMs cover structure is thicker than the second wafer of the MEMs cover structure.

6. The MEMs structure of claim 5, further comprising a plurality of bond pads on the surface of the substrate wafer, wherein the second wafer of the MEMs cover structure protects the bond pads from saw slurry of the dicing saw during dicing of the MEMs structure.

7. The MEMs structure of claim 6, further comprising a plurality of standoffs between the substrate wafer and the second wafer of the MEMs cover structure.

8. The MEMs structure of claim 7, wherein the MEMs device formed on the surface of the substrate wafer is one of an inertial sensor, an accelerometer, a gyroscope, an optical device, or a pressure sensor.

* * * * *